United States Patent [19]
Kauffman et al.

[11] 3,957,185
[45] May 18, 1976

[54] METHODS OF AND APPARATUS FOR THERMOCOMPRESSION BONDING WITH A COMPENSATING SYSTEM

[75] Inventors: Ronald D. Kauffman; Bennett L. Koppenhaver; Fred J. Schneider, all of Allentown, Pa.

[73] Assignee: Western Electric Company, Inc., New York, N.Y.

[22] Filed: Aug. 25, 1975

[21] Appl. No.: 607,535

[52] U.S. Cl. .............................. 228/106; 228/6 A; 228/44.1 A; 228/180 A; 269/310
[51] Int. Cl.² ....................................... H01L 21/88
[58] Field of Search ........... 228/44.1 A, 6 A, 180 A, 228/106, 5.5, 5.1, 49; 269/310; 29/626

[56] References Cited
UNITED STATES PATENTS

| | | | |
|---|---|---|---|
| 2,144,849 | 1/1939 | Moore | 269/310 X |
| 3,580,460 | 5/1971 | Lipschutz | 228/180 A X |
| 3,724,068 | 4/1973 | Galli | 228/6 A X |
| R28,509 | 8/1975 | Piechocki | 228/180 A |

*Primary Examiner*—Al Lawrence Smith
*Assistant Examiner*—K. J. Ramsey
*Attorney, Agent, or Firm*—R. Y. Peters

[57] ABSTRACT

In making electronic components, it is often necessary to bond a lead frame to an insulating substrate. In carrying out the bonding, it is desirable to provide compensation to prevent cracking of the substrate. At the same time it is also desirable to prevent relative motion between the substrate and lateral guides for accurately positioning the substrate with respect to a bonding tip. The prevention of such motion reduces the likelihood of damage to the guides. To these ends, the substrate is positioned on a supporting pedestal and on the first ends of a plurality of elongated members or rods slidable through the pedestal and having second ends mounted to spring elements. In so positioning the substrate, it is located between lateral guides which are fixed to the pedestal. Prior to bonding, the surface of the pedestal is urged flush with the surfaces of the first ends of the rods. Then, during bonding the pedestal is moved with the guides and the substrate. Also, during bonding the surfaces of the first ends of the rods slide through the pedestal to permit the spring elements to compensate for irregularities in the substrate to reduce stresses introduced into the substrate to reduce the cracking thereof.

10 Claims, 5 Drawing Figures

METHODS OF AND APPARATUS FOR THERMOCOMPRESSION BONDING WITH A COMPENSATING SYSTEM

BACKGROUND OF THE INVENTION

1. Field of the Invention

This invention relates to methods of and apparatus for thermocompression bonding with a compensating system, and more particularly to methods of and apparatus for thermocompression bonding segments of lead frames to brittle substrates upon which circuits are formed, wherein an improved compensating system counteracts irregularities in the substrates.

This invention is suited for use in the manufacture of electronic components, such as integrated-circuit packages, hybrid integrated circuits and thin-film circuits. It is particularly suited for bonding lead frames to conductive patterns on glass or ceramic insulating substrates having various electronic components formed or bonded thereon. Such lead frames are conventionally used to connect such components into a variety of electronic equipment.

2. Description of the Prior Art

In the manufacture of electronic components, lead frames are bonded to conductive patterns formed on insulating glass or ceramic substrates. In so bonding the lead frames, it has long been recognized that a system of compensation is necessary to counteract irregularities in the glass or ceramic substrates to reduce their likelihood of cracking. (See, for example, U.S. Pat. Nos. 3,608,809 and 3,669,806 issued to R. H. Cushman; U.S. Pat. Nos. 3,804,319; 3,823,863 and RE 28,509 issued to B. Piechocki, all of which are assigned to assignee of of record.) The ceramic materials that are presently used in many substrates for thin-film and integrated circuits are often warped and nonuniform in thickness. Thermocompression bonding of lead frames to conductive patterns on such substrates produce highly localized forces and stresses. The result of these stresses on the nonuniform substrates is a certain degree of irreparable cracking of the substrates with the consequent loss of the entire circuits.

While various systems have provided the desired compensation to eliminate cracking of substrates, they have resulted in relative motion between the substrates and lateral guides that hold and align the substrates in an apparatus for thermocompression bonding the lead frames to the substrates. Since the substrates are usually formed of hard materials, such as alumina ceramics, this motion seriously damages the guides by the wearing action of the edges of the substrates on the guides. When the guides are so damaged, they loose their ability to position the substrates with the required precision in the bonding apparatus. Consequently, during bonding, the segments of the lead frame to be bonded to the substrates are not properly aligned with respect to conductive patterns on the substrates, and mechanically and electrically sound bonds cannot be consistently made. This results in the highly disadvantageous loss of manufacturing yield and an increase in the unit cost of the circuits.

Accordingly, it is desirable to provide compensation to prevent cracking of the substrates in combination with expedients to prevent relative motion between the substrates and their guides.

Moreover, it is desirable to effectuate the bonding at high speeds with minimum operator handling to increase the output of the operators and bonding apparatus.

SUMMARY OF THE INVENTION

It is, therefore, an object of this invention to provide new and improved methods of and apparatus for thermocompression bonding with a compensating system. Another object of this invention is the provision of methods of and apparatus for thermocompression bonding of segments of lead frames to brittle substrates upon which circuits are formed wherein an improved compensating system counteracts irregularities in the substrates.

With these and other objects in view, the present invention contemplates a new method of bonding leads to an article, wherein the improvement includes positioning the article on a supporting member and on the first ends of a plurality of elongated members slidable through the supporting member and having second ends mounted to spring elements. During its positioning, the article is located between guides fixed to the supporting member. The surface of the supporting member is urged flush with the surfaces of the first ends of the elongated members prior to bonding the leads to the article. Then, during bonding the supporting member moves with the guides and the article to prevent damage to the guides. Also during bonding the surfaces of the first ends of the elongated members slide through the supporting member to enable the spring elements to compensate for irregularities in the article to reduce stresses introduced into the article to reduce cracking.

The present invention also contemplates a new apparatus for bonding leads to an article, wherein the improvement includes a supporting member having surfaces to which guides are fixed for locating the article on the supporting member and on first ends of a plurality of elongated members slidable through the supporting member. Second ends of the elongated members opposite the first ends are mounted on spring elements. Facilities are provided for urging the surfaces of the supporting members flush with the surfaces of the first ends of the elongated members prior to bonding the leads to the article. These facilities also enable the surfaces of the first ends of the elongated members to slide through the supporting member during bonding to compensate for irregularities in the article to reduce stresses introduced into the article to reduce cracking of the article.

BRIEF DESCRIPTION OF THE DRAWING

Other objects and advantages of the present invention may be more clearly understood by reference to the following detailed description and drawing wherein.

DETAILED DESCRIPTION

Lead Frame and Substrate to be Bonded

Figure 1:
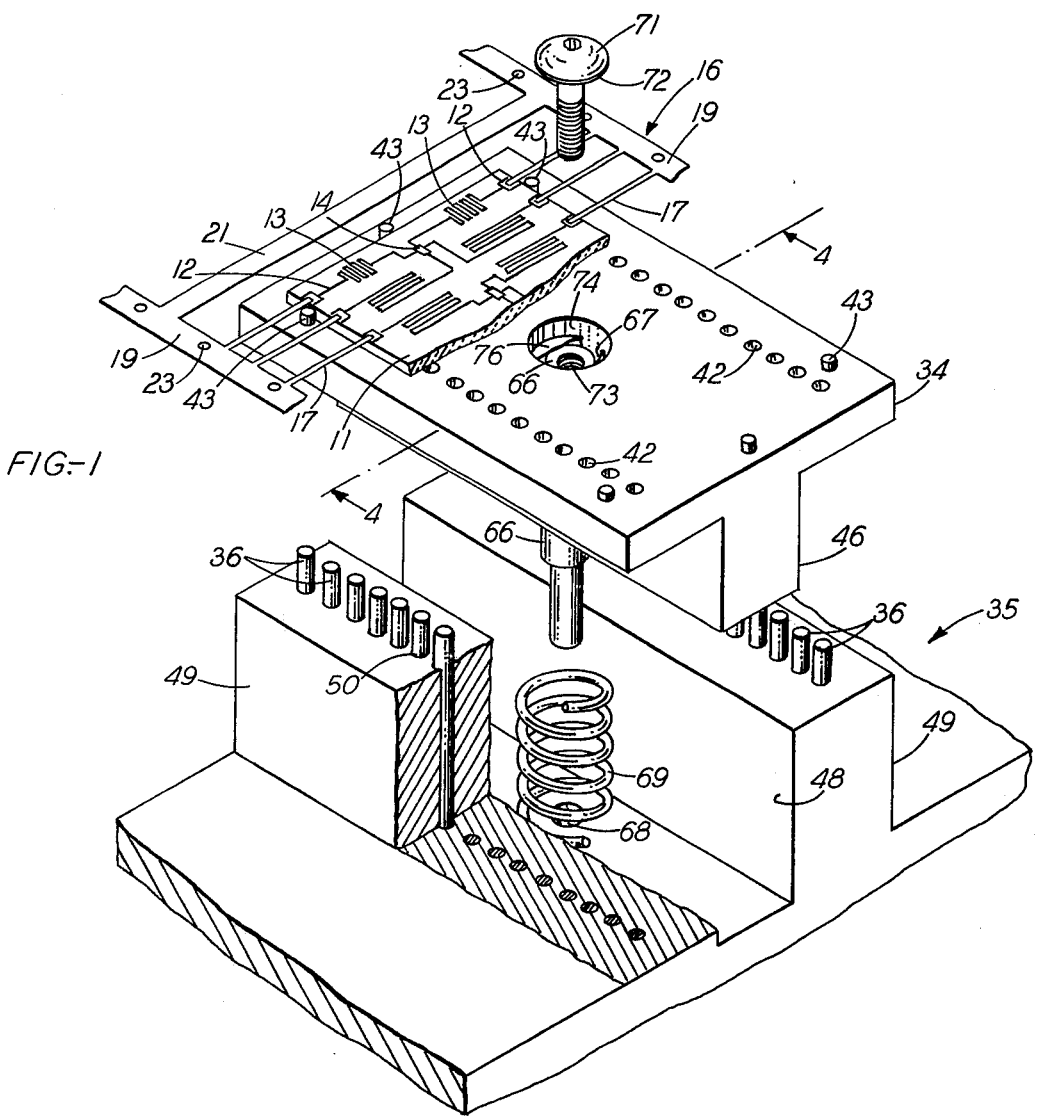
FIG. 1 is a perspective view, partly cut away, of a lead frame and a substrate having conductive patterns and components thereon, showing a plurality of leads interconnected by a perforated carrier strip and a supporting strip, showing the leads bonded to the conductive patterns in accordance with the present invention, and showing a portion of an improved compensating system of the present invention.

Referring now to the drawing and in particular to FIG. 1, an article or a substrate 11 is shown having a conductive pattern 12 and various active or inactive components formed thereon, such as resistors 13 and integrated circuit chips 14. The substrate 11 is substantially planar in configuration, and is formed of an insulating material such as a glass or an alumina ceramic. Also shown in FIG. 1 is a lead frame, designated generally by the numeral 16, which is to be bonded to the substrate 11 in accordance with the present invention.

The frame 16 includes a segment of leads 17 which have their outer ends interconnected by outer carrier strips 19. To laterally support opposite segments of the leads 17 with respect to each other, the leads 17 may be interconnected by intermediate support strips 21. Preferably, a plurality of the lead frames 16 are interconnected into a continuous strip of indefinite length by way of the carrier strips 19, although for convenience only one such frame 16 is shown in FIG. 1. Perforations 23 are formed in the carrier strips 19 to enable the lead frames 16 to be conveniently handled by, and automatically fed into, various fabricating and handling equipment.

Typically, the lead frames 16 are stamped from a copper sheet (with trace amounts of silver). They usually have various plated layers such as nickel and gold, with the gold being the outermost layer. The frames 16 are substantially planar in configuration and are pliable enough to be rolled up lengthwise about a 3 inch radius without damaging them.

Overall Method and Apparatus

Figure 2:
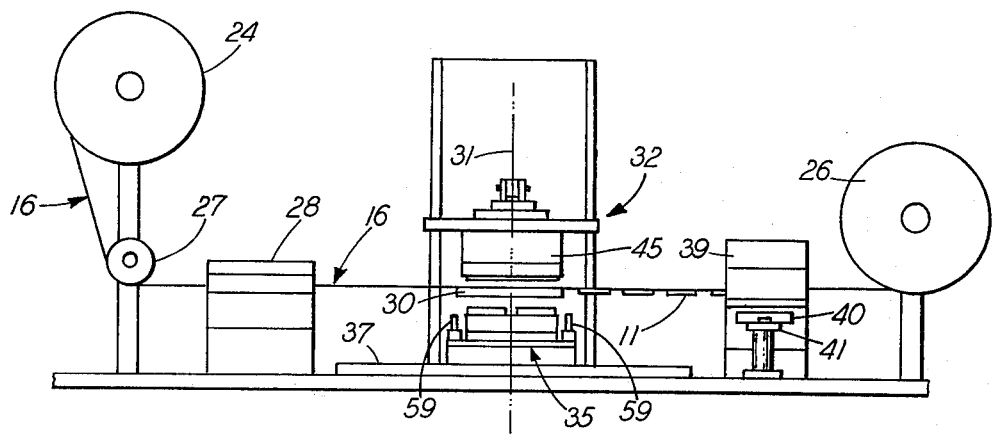
FIG. 2 is a side elevational view of the overall apparatus of the present invention for bonding the leads of FIG. 1 to the substrate of FIG. 1, showing a bonder and the improved compensating system of the present invention.
Figure 3:
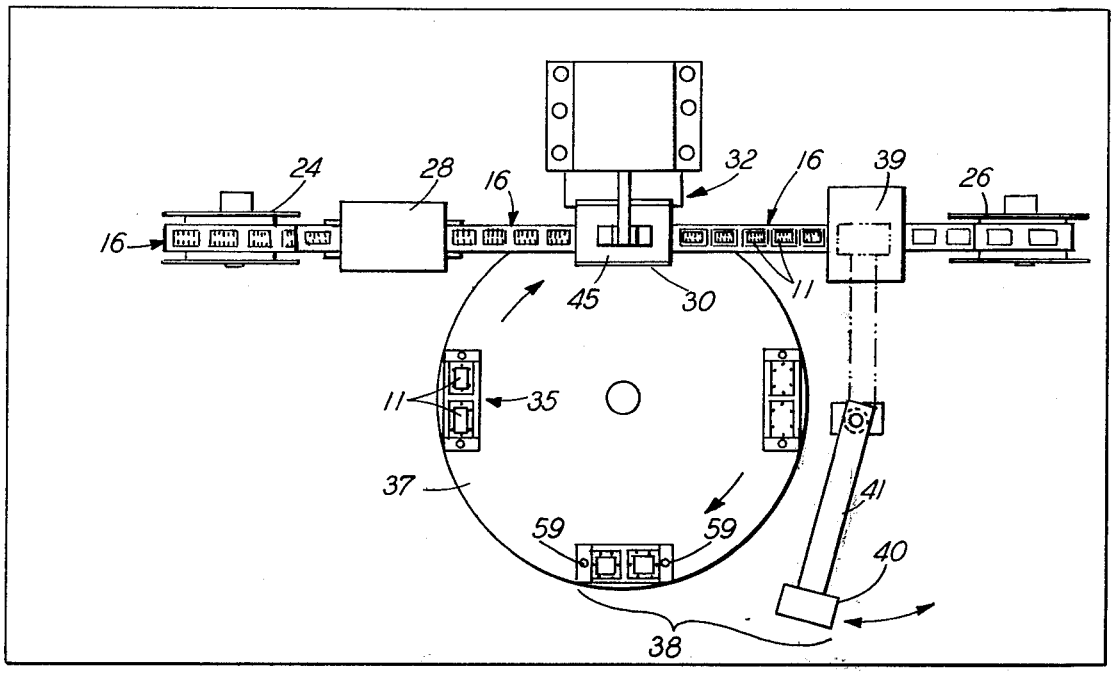
FIG. 3 is a plan view of FIG. 2, showing the manner in which substrates and lead frames are fed to the bonder of FIG. 2.

In accordance with the methods and apparatus of the present invention, the lead frame 16 is bonded to the substrate 11, as shown in FIG. 1. Referring now to FIGS. 2 and 3, an overall apparatus is shown for carrying out the bonding. The apparatus includes a supply reel 24 upon which an indefinite length of interconnected lead frames 16 are rolled up. From the reel 24 the lead frames 16 are advanced intermittently by a driven takeup reel 26 under a guide roller 27, through a conventional lead-frame straightener 28. From the straightener 28, the lead frames 16 are fed through a slot 29 (FIG. 4) of a trackway 30 to a bonding axis 31 of a bonder, designated generally by the numeral 32.

Figure 4:
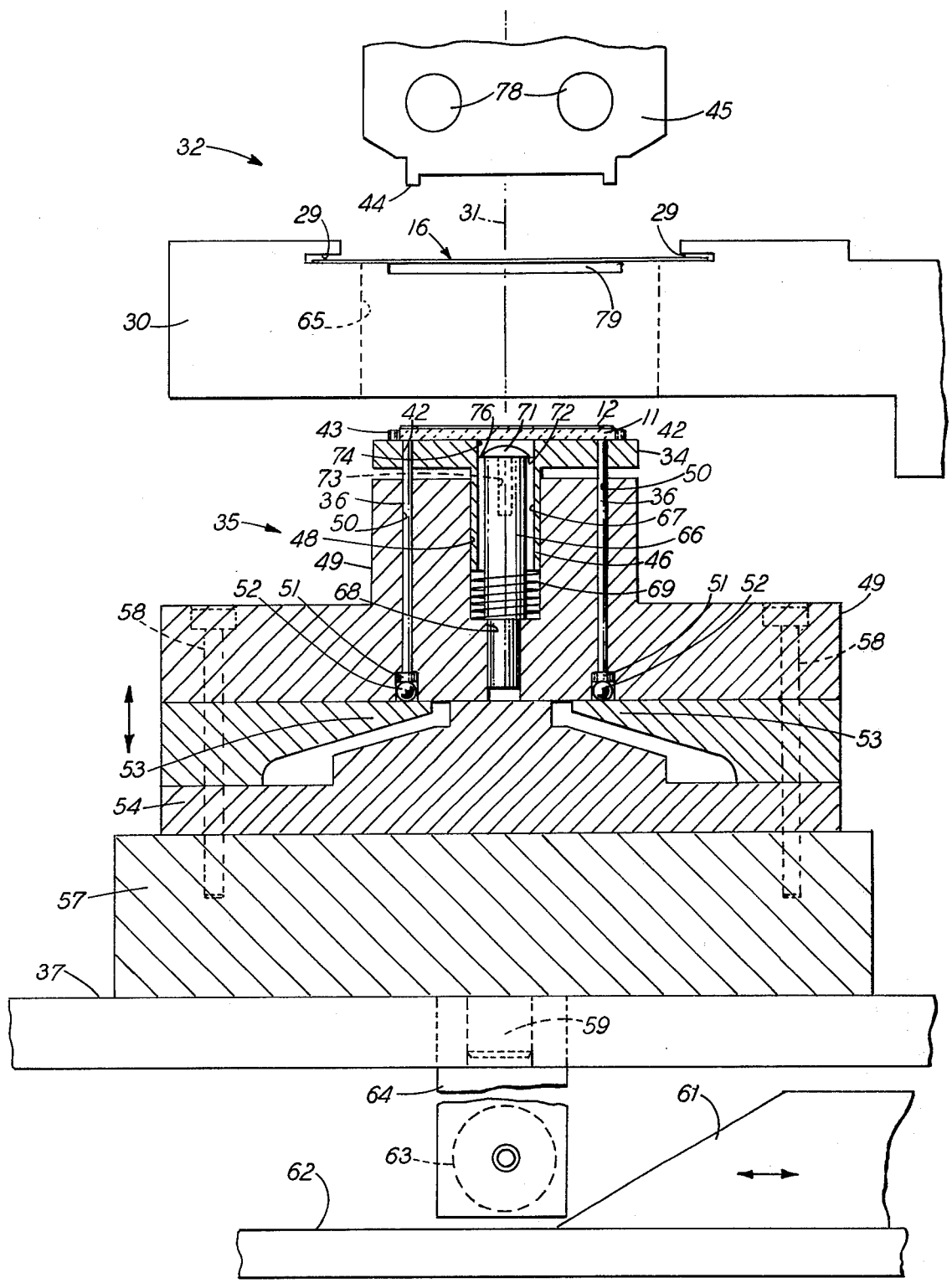
FIG. 4 is a side elevational view, partially in section, taken along lines 4—4 of FIG. 1, showing the relationship of a bonding tip, a trackway holding the lead frames and the compensating system of the present invention prior to bonding.

In addition to feeding the lead frames 16 to the bonding axis 31, the substrates 11 are fed to such axis 31. In carrying out such feeding, each substrate 11 is placed on an upper, substantially planar surface of a supporting member or pedestal 34 of a compensating system, designated generally by the numeral 35, and on the end surfaces of a plurality of elongated members or rods 36. A plurality of the compensating systems 35, which have been improved in accordance with the present invention, are mounted to a multiposition rotary indexing table 37, as shown in FIGS. 3 and 4. The placing of the substrates 11 is accomplished at a loading and unloading position 38 of the table 37 by an operator or dispensing equipment (not shown) as the table 37 intermittently rotates in the direction shown by the arrows of FIG. 3. Such rotation of the table 37 feeds the substrates 11 one at a time to the bonding axis 31. However, any number of the substrates may be fed at a time, and FIG. 3 shows, for example, feeding two substrates 11 at a time to the bonding axis 31 of the bonder 32.

After both the lead frames 16 and the substrates 11 are fed to the bonder 32, it bonds each segment of the leads 17 of each frame 16 to each of a plurality of the substrates 11. Then, the frames 16 are fed through a conventional punch and die 39, which separates the bonded leads 17 and the substrates 11 from the strips 19 and 21. The driven takeup reel 26 then winds up the strips 19 and 21.

After each substrate 11 with its bonded leads 17 is separated from the strips 19 and 21, such substrate 11 drops from the punch and die 39 onto a platform 40. A pivotal swing arm 41 fixed to the platform 40 then carries the bonded substrate 11 back to the loading and unloading position 38 of the table 37, where an operator or unloading equipment (not shown) unloads the bonded substrate 11 from the platform 40.

Compensating System

Considering the compensating system 35 of the present invention in greater detail, reference is made to FIGS. 1 and 3–5, which show the rods 36 slidably mounted in apertures 42 of the pedestal 34. Prior to bonding, the end surfaces of the rods 36 extend to the surface of the pedestal 34, as shown in FIGS. 1 and 4. In placing each substrate 11 on each pedestal 34, lateral guides or pins 43 are used to align the conductive pattern 12 (FIG. 1) with respect to a bonding tip 44 (FIG. 4) of the bonding head 45 of the bonder 32 and to locate one such rod 36 at a point on the substrate 11 opposite to where one lead 17 is to be bonded.

The pedestal 34 includes a central portion 46 (FIGS. 1 and 4) that extends from its lower surface opposite the upper planar surface into an opening 48 of a housing 49, the portion 46 being slidably movable in the opening 48. Also extending through the housing 49 are the slidable rods 36, which are laterally supported by, and slidable in, apertures 50 of such housing 49. An enlarged portion or head 51 (FIG. 4) of each rod 36 and a coacting spherical member 52 are located in a plurality of counterbores formed in the housing 49, as shown in FIG. 4. The spherical members 52 prevent sliding motion between the heads 51 of the rods 36 and a plurality of spring elements 53 located beneath such members 52 and reduce the wear of the heads 51 and the elements 53. The spherical members 52 also provide point contacts for the rods 36 against the spring elements 53 to move definitely and consistently locate the force of the elements 53 against the rods 36.

Figure 5:
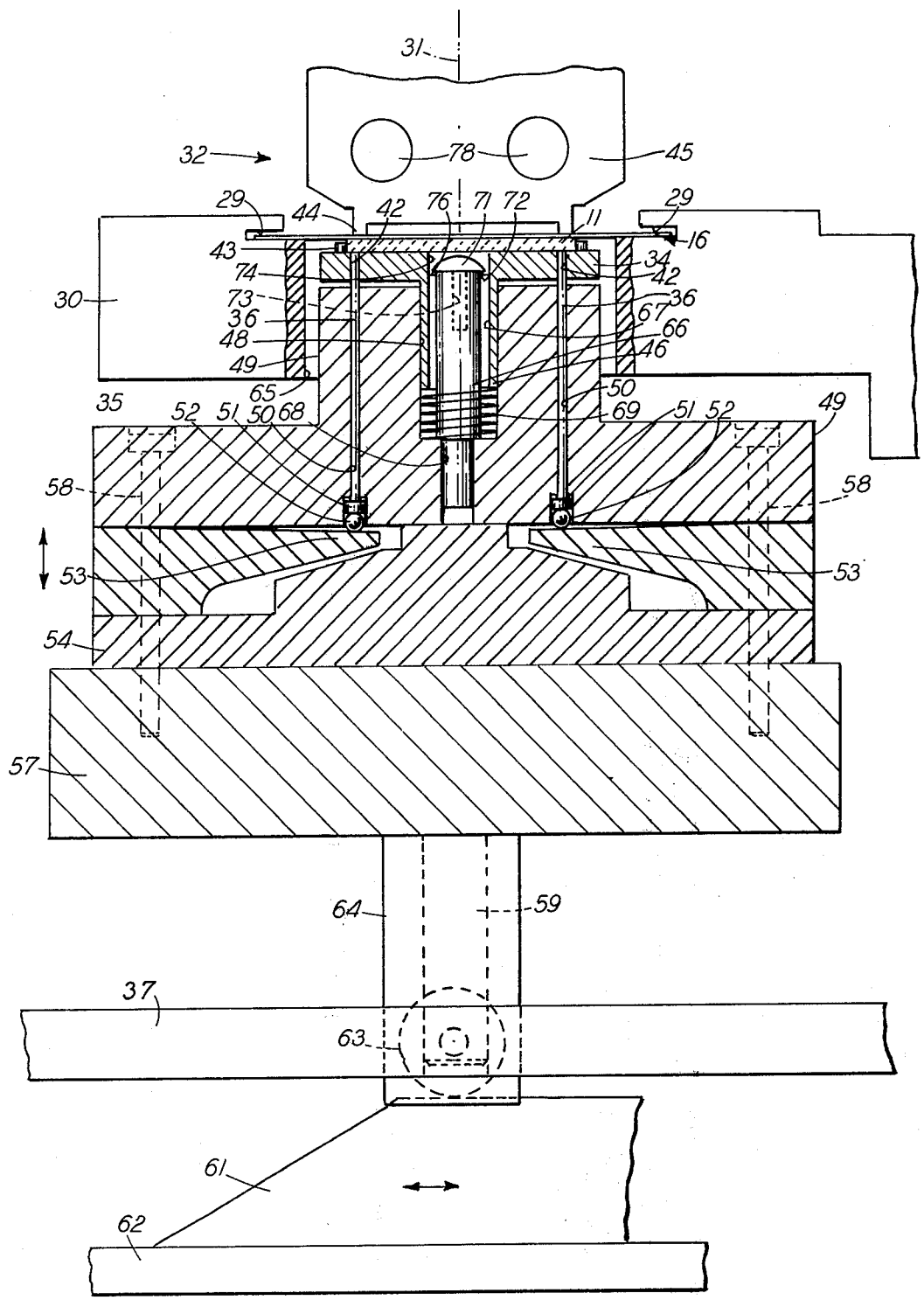
FIG. 5 shows the relationship of the elements of FIG. 4 during bonding.

Preferably, the spring elements 53 are cantilever in configuration and have one such element 53 associated with each spherical member 52 and each rod 36, and are of the type disclosed in the aforementioned Piechocki patents. The spring elements 53 are mounted to a base 54 which is fixed to a supporting block 57 by any conventional joining expedients such as machine bolts 58. The block 57 is mounted to the table 37 by two supporting rods 59 (FIGS. 2 and 3) having their lowermost ends fixed to the table 37. The block 37 is capable of being lifted upwardly from the table 37, while being laterally supported by the rods 59, a distance equal to the height of a camming wedge 61, as shown in FIG. 5. The upward lifting is produced by energizing an air cylinder (not shown) which imparts reciprocal motion, in a leftward direction as shown by the arrow in FIG. 4, to the wedge 61 which is slidably mounted to a fixed base 62. This pushes upwardly a cam follower 63, which is rotatably mounted to a yoke 64 fixed to the supporting block 57. Such upward pushing moves the pedestal 34 into an opening 65 in the trackway 30 in preparation for bonding.

One end of a shaft 66 (FIGS. 1 and 4) located in an opening 67 of the central portion 46 of the pedestal 34 is fixedly mounted in an aperture 68 of the housing 49 in any conventional manner, such as by force-fitting such end into the aperture 68. The pedestal 34 is movable along the shaft 66 and is laterally restrained by the opening 67 against such shaft 66 and by the central portion 46 against the opening 48. A compression spring 69 located about the shaft 66 exerts a predetermined force between the central portion 46 of the pedestal 34 and the housing 49, tending to urge the planar surface of the pedestal 34 flush with the surfaces of the ends of the rods 36.

A conventional socket-type button screw 71 having a head with a lower surface 72 is fastened into an aperture 73 formed in the other end of the shaft 66 such that the head of the screw 71 is located within a counterbore 74. The counterbore 74 forms upper edges 76 adjacent the opening 67, as shown in FIGS. 1 and 4. These edges 76 coact with the lower surfaces 72 of the head of the button screw 71, the lower surface 72 acting as a stop against which the upper edges 76 of the counterbore 74 are forced by the spring 69 in maintaining the planar surface of the pedestal 38 flush with the surfaces of the ends of the rods 36 prior to bonding.

Inasmuch as the opening 67 has the configuration of a slot, as shown in FIG. 1, the likelihood of the shaft 66 binding in the opening 67 is reduced, while at the same time the opening 67 confines movement of the pedestal 34 along the opening 48.

Bonding Cycle

In the operation of the overall bonding apparatus of FIGS. 2 and 3 in carrying out a bonding cycle, the substrates 11, which have been positioned on the pedestal 34, are intermittently rotated by the table 37 to the bonding axis 31 of the bonder 32 where at least one of the substrates 11 comes to a stationary position on such axis 31. Also, the lead frames 16, which are supported by the slot 29 of the trackway 30, are fed intermittently through such slot 29 to such axis 31. Then, the frames 16 come to rest on such axis 31 to align a segment of the leads 17 of one of the frames 16 in a spaced relationship with respect to the conductive pattern 12 of the stationary substrate 11.

At this time the lead frame 16, the substrate 11, and its pedestal 34 are in the position shown in FIG. 4. Also, at this time the compression spring 69, which exerts less force than the spring elements 53, maintains the upper surface of the pedestal 34 flush with the surfaces of the ends of the rods 36.

The air cylinder (not shown) is then energized to reciprocate the wedge 61 leftwardly as viewed in FIG. 4. This forces the wedge 61 against the cam follower 62 to push the supporting block 57 and compensating system 35 upwardly to move the pedestal 34 and a portion of the housing into the opening 65 in the trackway 30, as shown in FIG. 5. Such movement, which is perpendicular to the movement of the frames 16, positions the conductive pattern 12 of the substrate 11 adjacent the segment of leads 17 of the lead frame 16 in preparation for bonding.

To bond the segment of the leads 17 to the pattern 12 of the substrate 11, the bonding head 45 is moved downwardly by conventional facilities (not shown) to force the tip 44, which is heated by conventional heaters 78, against the leads 17 to effect a thermocompression bond between the leads 17 and pattern 12. During bonding the guide pins 43 move with the pedestal 34 to prevent relative motion between the substrate 11 and the pins 43, thereby preventing damage to, or excessive wear of, the pins 43. This enables the guide pins 43 to accurately locate the conductive pattern 12 relative to the leads 17, even after the pins 43 have been used many times. Such accurate location enhances both the mechanical and electrical soundness of the bonds between the leads 17 and the pattern 12.

During bonding as the tip 44 of the bonding head 45 presses against the substrate 11 positioned on the pedestal 34, the spring 69 compresses and enables the surfaces of the ends of the rods 36 to slide through the pedestal 34. This enables the spring elements 53 to deflect, as shown in FIG. 5, to compensate for irregularities in the substrate 11. This, in turn, reduces stresses introduced into the substrate 11 to reduce the likelihood of the cracking of such substrate 11.

After the substrate 11 is bonded to the leads 17 of the frame 16, the bonding head 45 and the compensating system 35 move away from the bonded substrate 11 to the positions shown in FIG. 4, the movement of the system 35 being effected by de-energizing the air cylinder (not shown). The frame 16 is then advanced to remove the substrate 11 and the frame 16 from the bonder 32, with the bonded substrate 11 passing through a slot 79 (FIG. 4) in the trackway 30. Next, the substrate 11 and frame 16 are intermittently fed into the punch and die 39 which severs the carrier and support strips 19 and 21 from the frame 16 and separates the leads 17 from each other. This releases the substrate 11 to the platform 40; whereupon the arm 41 swings the substrate 11 to the loading and unloading position 38 of the table 37.

The cycle of operation is continued to bond successively other substrates 11 to other segments of leads 17 of the interconnected lead frame 16 in the aforedescribed manner. This results in making mechanically and electrically sound bonds at high speeds with minimum operator handling.

It is to be understood that the above-described arrangements are simply illustrative of the application of the principles of the present invention. Numerous other arrangments may be readily devised by those skilled in the art which embody the principles of the invention and fall within its spirit and scope.

What is claimed is:

1. In a method of bonding leads to an article, the improvement comprising the steps of:
    positioning the article on a supporting member and on the first ends of a plurality of elongated members slidable through the supporting member and having second ends mounted to spring elements, and locating the article during its positioning between guides fixed to the supporting member;

urging the surface of the supporting member flush with the surfaces of the first ends of the elongated members prior to bonding the leads to the article; and moving the supporting member with the guides and the article during bonding to prevent damage to the guides, and further sliding the surfaces of the first ends of the elongated members through the supporting member during bonding to permit the spring elements to compensate for irregularities in the article to reduce stresses introduced into the article to reduce cracking thereof.

2. The method of claim 1 further comprising the steps of:
   intermittently advancing the leads to a bonding axis of a bonder prior to bonding; and
   intermittently rotating the article and the supporting member to such axis prior to bonding.

3. The method of claim 1, wherein the leads are in the form of a lead frame of an indefinite length, and wherein a segment of the lead frame is bonded to a conductive pattern formed on the article, the method further comprising the steps of:
   intermittently rotating the article and the supporting member to a bonding axis of a bonder;
   feeding intermittently the lead frame through a trackway having a central opening at least slightly larger than the outer dimensions of the supporting member, such feeding resulting in the movement of the segment to be bonded to such bonding axis and in a spaced relationship with respect to the pattern of the article to be bonded;
   moving the supporting member through the opening in the trackway to position the conductive pattern of the article adjacent the segment of the lead frame prior to bonding;
   moving the supporting member out of the opening of the trackway after bonding leaving the article bonded to the lead frame; and
   again feeding the lead frame through the trackway to remove the bonded article from the bonding axis.

4. In a method of bonding a lead frame to a conductive pattern of a substantially planar substrate, the improvement comprising the steps of:
   positioning the substrate on a substantially planar surface of a supporting pedestal and on the first ends of a plurality of rods slidable through the supporting pedestal and having second ends mounted on spring elements, and locating the substrates during this positioning between lateral guiding pins fixed to the supporting pedestal;
   urging the surface of the supporting pedestal flush with the surfaces of the first ends of the rods prior to bonding the lead frame to the conductive pattern on the substrate; and
   permitting the supporting pedestal to move with the guiding pins during bonding to prevent damage to the guiding pins, and further permitting the surfaces of the first ends of the rods to slide through the supporting pedestal during bonding to further permit the spring elements to compensate for irregularities in the substrate to reduce stresses introduced into the substrate to prevent cracking thereof.

5. The method of claim 4, comprising the additional steps of limiting prior to bonding the urging of the supporting pedestal to maintain the surface of the pedestal flush with the surfaces of the first ends of the rods prior to bonding.

6. In a compensating apparatus for bonding leads to an article, the improvement comprising:
   a supporting member having a surface to which a plurality of guides are fixed for locating the article on the supporting member and on first ends of a plurality of elongated members slidable through the supporting member, second ends of the elongated members opposite the first ends being mounted on spring elements; and
   means for urging the surface of the supporting member flush with the surfaces of the first ends of the elongated members prior to bonding the leads to the article, and for enabling the surfaces of the first ends of the elongated members to slide through the supporting member during bonding to compensate for irregularities in the article to reduce stresses introduced into the article to reduce cracking of the article.

7. The apparatus of claim 6, wherein the leads are in the form of a lead frame of indefinite length, and wherein a segment of the lead frame is bonded to a conductive pattern formed on the articles, the apparatus further comprising:
   means for rotatably and intermittently feeding the article and the supporting member to a bonding axis of a bonder;
   means for feeding intermittently the lead frame through a trackway having a central opening at least slightly larger than the outer dimensions of the supporting member to move the segment of the lead frame to be bonded to such bonding axis in a spaced relationship with respect to the pattern of the article to be bonded;
   means for moving the supporting member through the opening in the trackway to position the conductive pattern of the article adjacent the segment of the lead frame prior to bonding; and
   means for again feeding the lead frame through the trackway to remove the bonded article from the bonding axis.

8. The apparatus of claim 7, wherein the rotating means has a loading and unloading position, and further comprising:
   means for severing the bonded article from the lead frame; and
   means for feeding the severed article to such position.

9. In a compensating system for bonding a lead frame to a conductive pattern on a planar article, wherein the article is positioned between lateral guiding pins and on first ends of a plurality of rod slidably mounted in a housing, wherein second ends of the rods opposite the first ends are mounted on spring elements located between the housing and a base member, the improvement comprising:
   a supporting pedestal having a substantially planar first surface to which the guiding pins are fixed and onto which the article is positioned with the conductive pattern facing upwardly, the rods being slidable through the pedestal, a second surface of the pedestal opposite the first surface being adjacent the housing, the pedestal including a central portion extending from its second surface into an opening in the housing and a stopping edge;
   a shaft extending in the opening of the housing and having one end fixed to the housing, the other end having a stopping edge that cooperates with the stopping edge of the pedestal; and means positioned about said shaft for urging the stopping edge of the shaft against the stopping edge of the pedestal to urge the first surface of the supporting member flush with the surfaces of the first ends of the rods prior to bonding the leads to the article, for permitting the supporting pedestal to move with the guiding pins during bonding to prevent damage to the guiding pins, and for further permitting the surfaces of the first ends of the rods to slide through the supporting member during bonding to compensate for irregularities in the article to reduce stresses introduced into the article to prevent cracking of the article.

10. The apparatus of claim 9, wherein the spring elements exert a greater force than the urging means.

* * * * *